(12) United States Patent
Lee et al.

(10) Patent No.: US 9,244,351 B2
(45) Date of Patent: Jan. 26, 2016

(54) COMPOSITION FOR HARDMASK, METHOD OF FORMING PATTERNS USING THE SAME, AND SEMICONDUCTOR INTEGRATED CIRCUIT DEVICE INCLUDING THE PATTERNS

(71) Applicants: Sung-Jae Lee, Uiwang-si (KR);
Joon-Young Moon, Uiwang-si (KR);
Youn-Jin Cho, Uiwang-si (KR);
Young-Min Kim, Uiwang-si (KR);
Yong-Woon Yoon, Uiwang-si (KR)

(72) Inventors: Sung-Jae Lee, Uiwang-si (KR);
Joon-Young Moon, Uiwang-si (KR);
Youn-Jin Cho, Uiwang-si (KR);
Young-Min Kim, Uiwang-si (KR);
Yong-Woon Yoon, Uiwang-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 14/368,858

(22) PCT Filed: Nov. 23, 2012

(86) PCT No.: PCT/KR2012/009983
§ 371 (c)(1),
(2) Date: Jun. 26, 2014

(87) PCT Pub. No.: WO2013/100375
PCT Pub. Date: Jul. 4, 2013

(65) Prior Publication Data
US 2014/0335447 A1 Nov. 13, 2014

(30) Foreign Application Priority Data

Dec. 30, 2011 (KR) .................. 10-2011-0147875
Nov. 19, 2012 (KR) .................. 10-2012-0131181

(51) Int. Cl.
*G03F 7/40* (2006.01)
*G03F 7/11* (2006.01)
*G03F 7/09* (2006.01)
*H01L 21/027* (2006.01)
*G03F 7/075* (2006.01)
*H01L 21/033* (2006.01)

(52) U.S. Cl.
CPC .............. *G03F 7/094* (2013.01); *G03F 7/0752* (2013.01); *G03F 7/09* (2013.01); *G03F 7/091* (2013.01); *G03F 7/40* (2013.01); *H01L 21/0276* (2013.01); *H01L 21/0332* (2013.01)

(58) Field of Classification Search
None
See application file for complete search history.

(56) References Cited

U.S. PATENT DOCUMENTS

2008/0160461 A1* 7/2008 Yoon et al. ................... 430/323
2010/0021830 A1 1/2010 Kim et al.

FOREIGN PATENT DOCUMENTS

| JP | 2006-053404 A | 2/2006 |
| JP | 2009-025670 A | 2/2009 |
| JP | 2010-026221 A | 2/2010 |
| JP | 2010-160189 A | 7/2010 |
| KR | 10-2008-0107210 A | 12/2008 |
| KR | 10-2009-0120827 A | 11/2009 |
| KR | 10-2010-0072660 A | 7/2010 |
| TW | 201202295 A1 | 1/2012 |
| TW | 201229671 A | 7/2012 |
| TW | 201229672 A | 7/2012 |

OTHER PUBLICATIONS

International Search Report mailed Mar. 28, 2013 in International Patent Appliction No. PCT/KR2012/009983.

* cited by examiner

*Primary Examiner* — Cynthia Hamilton
(74) *Attorney, Agent, or Firm* — Lee & Morse, P.C.

(57) ABSTRACT

A composition for a hardmask including copolymer including repeating units represented by Chemical Formulae 1 and 2 and a solvent, a method of forming a pattern using the same, and a semiconductor integrated circuit device including a pattern formed using the method are provided.

12 Claims, No Drawings

COMPOSITION FOR HARDMASK, METHOD OF FORMING PATTERNS USING THE SAME, AND SEMICONDUCTOR INTEGRATED CIRCUIT DEVICE INCLUDING THE PATTERNS

TECHNICAL FIELD

A composition for a hardmask, a method of forming a pattern using the same, and a semiconductor integrated circuit device including the pattern are disclosed.

BACKGROUND ART

In the industrial fields of, for example, fabricating a microscopic structure (e.g., a micromachine, a magneto-resist head, and the like) as well as microelectronics, it is required to provide a number of circuits more than expected in the provided chip size by decreasing the pattern size. Effective lithographic techniques are essential to achieve a reduction in the size of structural shapes. Lithography affects on fabricating a microscopic structure in the views of directly imagining a pattern on a predetermined substrate and of providing a mask typically used for the imagification.

A typical lithographic process involves the following processes. First, a radiation-sensitive resist is exposed in patternwise method to form a patterned resist layer. Subsequently, the exposed resist layer is developed using a developing solution. Then, the substance present in openings of the patterned resist layer is etched to transfer a pattern to an underlying material. After completion of the transfer, remaining portions of the resist layer are removed.

However, in some lithographic imagification processes, the used resist does not provide an enough resistance for the subsequent etching step so that a predetermined pattern is not effectively transferred to the layer on the back surface. Accordingly, for example, when requiring an ultra-thin resist layer, the underlayer, called a hardmask layer, is used as an intermediate layer between the resist layer and the underlying material that may be transferred from the patterned resist to be patterned in the case that the underlying material to be etched is thick; in the case of requiring a considerable etching depth; and/or in the case of requiring a certain etchant for the predetermined underlying material.

The hardmask layer receives a pattern from a patterned resist layer, and should endure an etching process required for transferring a pattern to an underlying material.

The hardmask layer is required for a lithography technology using a composition for a hardmask having etching selectivity and an enough resistance against the multietching and also being capable of minimizing the reflectivity between resist and underlying layer. A pattern using such a hardmask composition may have improved optical properties.

DISCLOSURE

Technical Problem

One embodiment provides a composition for a hardmask having excellent etch resistance and antireflective characteristics.

Another embodiment provides a method of forming a pattern using the composition for a hardmask.

Yet another embodiment provides semiconductor integrated circuit device including a pattern formed by the method of forming a pattern.

Technical Solution

According to one embodiment, a composition for a hardmask that includes a copolymer including repeating units represented by the following Chemical Formulae 1 and 2; and a solvent is provided.

[Chemical Formula 1]

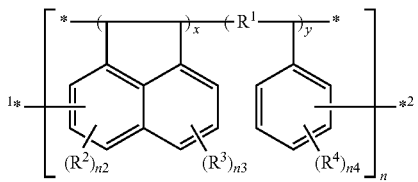

[Chemical Formula 2]

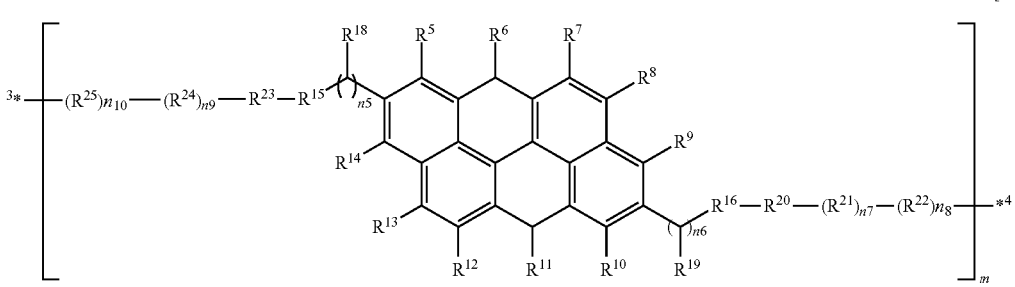

In Chemical Formulae 1 and 2, $R^1$ is a substituted or unsubstituted C1 to C20 alkylene group, a substituted or unsubstituted C2 to C20 alkenylene group, a substituted or unsubstituted C2 to C20 alkynylene group, or a substituted or unsubstituted C6 to C30 arylene group, $R^2$ to $R^4$, $R^5$ to $R^{14}$, $R^{18}$ and $R^{19}$ are independently hydrogen, a hydroxyl group, an amino group, a thiol group, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C2 to C20 heterocycloalkyl group, a substituted or unsubstituted C2 to C20 heterocycloalkenyl group, a substituted or unsubstituted C2 to C20 heterocycloalkynyl group, or a substituted or unsubstituted C6 to C30 aryl group, provided that at least one of $R^5$ to $R^{14}$ is a hydroxyl group, an amino group, or a thiol group, and, $R^{18}$ and $R^{19}$ includes at least one hydroxyl group, $R^{15}$ and $R^{16}$ are independently a substituted or unsubstituted C6 to C30 arylene group, $R^{20}$ to $R^{25}$ are independently a substituted or unsubstituted C1 to C20 alkylene group, a substituted or unsubstituted C2 to C20 alkenylene group, a substituted or unsubstituted C2 to C20 alkynylene group, or a substituted or unsubstituted C6 to C30 arylene group, $n^2$ to $n^4$ are independently $0 \leq n^2 \leq 2$, $0 \leq n^3 \leq 3$ and $0 \leq n^4 \leq 4$, $n^5$ and $n^6$ are integers ranging from 1 to 10, $n^7$ to $n^{10}$ are integers ranging from 0 to 10, $x+y=1$, $0 \leq x \leq 1$, and $0 \leq y \leq 1$, n and m are independently integers ranging from 1 to 200, and $*^2$ and $*^3$ are linked to each other, $*^1$ and $*^4$ are linked to each other.

In Chemical Formula 2, $R^{15}$ and $R^{16}$ may be independently a phenylene group, a naphthylene group, or a C1 to C20 alkoxy phenylene group.

In Chemical Formula 2, $R^{20}$ to $R^{25}$ are independently a substituted or unsubstituted C1 to C20 alkylene group, or a substituted or unsubstituted C6 to C30 arylene group, and $n^7$ to $n^{10}$ are independently integers of 0 to 5.

In Chemical Formulae 1 and 2, n and m are independently integers of 1 to 100, and a mole ratio of m/n is 0.01 to 20.

The copolymer may include at least one selected from a copolymer including a structural unit represented by the following Chemical Formula 3-1, a copolymer including a structural unit represented by the following Chemical Formula 3-2, a copolymer including a structural unit represented by the following Chemical Formula 3-3, a copolymer including a structural unit represented by the following Chemical Formula 3-4, and a copolymer including a structural unit represented by the following Chemical Formula 3-5.

[Chemical Formula 3-1]

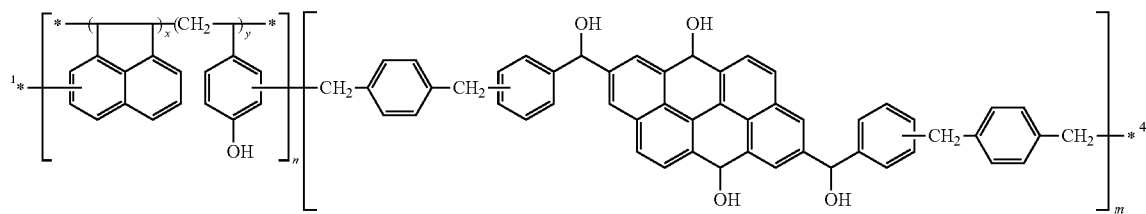

[Chemical Formula 3-2]

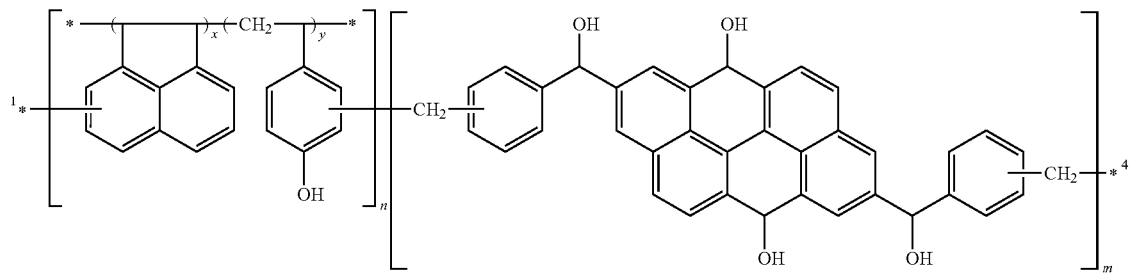

[Chemical Formula 3-3]

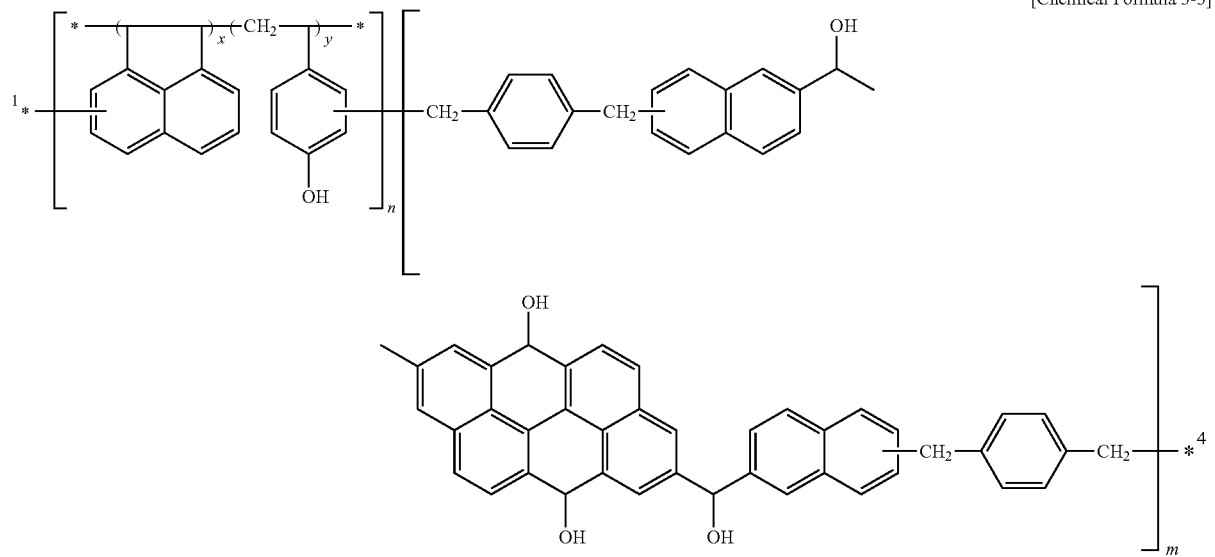

-continued

[Chemical Formula 3-4]

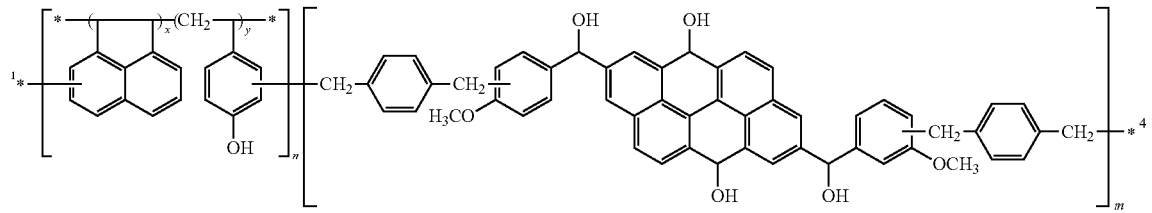

[Chemical Formula 3-5]

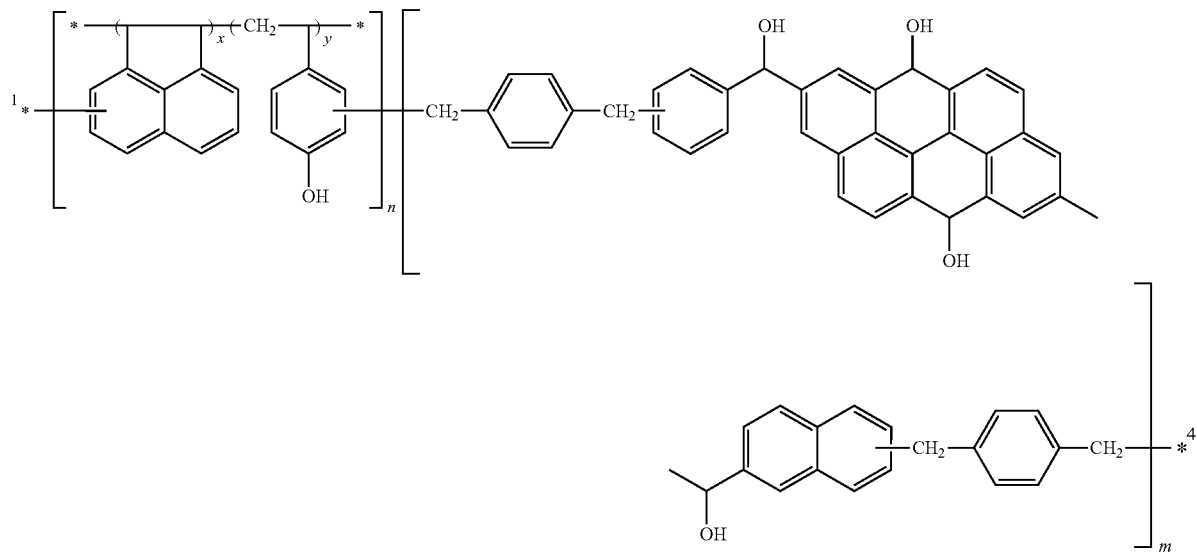

In Chemical Formulae 3-1 to 3-5, x+y=1, 0≤x≤1, 0≤y≤1, and n and m are integers ranging from 1 to 200, respectively.

The copolymer may have a weight average molecular weight of 1,000 g/mol to 1,000,000 g/mol.

The copolymer may be included in an amount of 1 wt % to 50 wt % based on the total amount of the composition for a hardmask.

According to another embodiment, provided is a method of forming a pattern that includes providing a material layer on a substrate; applying the composition for a hardmask on the material layer to form a hardmask layer; forming a silicon-containing thin layer on the hardmask layer; forming a photoresist layer on the silicon-containing thin layer; exposing and developing the photoresist layer to form a photoresist pattern; selectively removing the silicon-containing thin layer and hardmask layer using the photoresist pattern to expose a part of the material layer; and etching an exposed part of the material layer.

The composition for a hardmask may be applied using a spin-on coating method.

The method may further include forming a bottom antireflection coating (BARC) on the silicon-containing thin layer after forming the silicon-containing thin layer.

The hardmask layer may be heat-treated at 100° C. to 300° C.

According to yet another embodiment, a semiconductor integrated circuit device including a plurality of pattern formed using the method of forming a pattern is provided.

Hereinafter, further embodiments of this disclosure will be described in detail.

Advantageous Effects

The composition for a hardmask has excellent etching resistance and antireflective properties.

BEST MODE

Exemplary embodiments will hereinafter be described in detail. However, these embodiments are only exemplary and do not limit the present invention.

As used herein, when a definition is not otherwise provided, the term 'substituted' may refer to a halogen (F, Br, Cl, or I), a hydroxyl group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C4 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof instead of at least one hydrogen of a compound.

As used herein, when a definition is not otherwise provided, the term "hetero" refers to one including at least one heteroatom selected from N, O, S, and P.

Hereinafter, a composition for a hardmask according to one embodiment is described.

The composition for a hardmask according to one embodiment includes a copolymer including repeating units represented by the following Chemical Formulae 1 and 2.

[Chemical Formula 1]

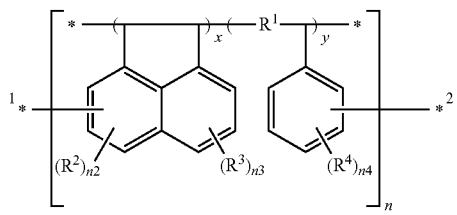

[Chemical Formula 2]

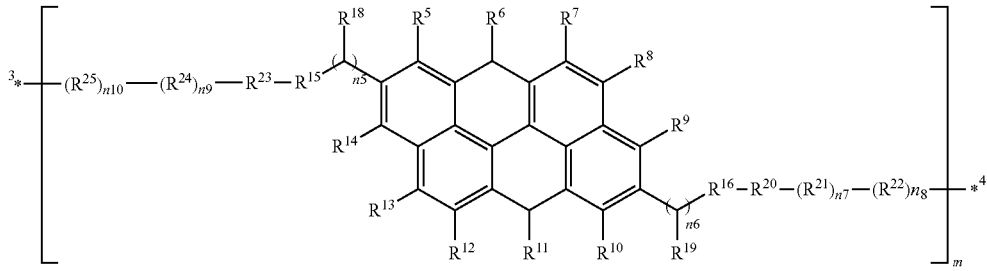

In Chemical Formula 1, $R^1$ may be a substituted or unsubstituted C1 to C20 alkylene group, a substituted or unsubstituted C2 to C20 alkenylene group, a substituted or unsubstituted C2 to C20 alkynylene group, or a substituted or unsubstituted C6 to C30 arylene group.

In Chemical Formula 1 and 2, $R^2$ to $R^4$, $R^5$ to $R^{14}$, $R^{18}$ and $R^{19}$ may be independently hydrogen, a hydroxyl group, an amino group, a thiol group, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C2 to C20 heterocycloalkyl group, a substituted or unsubstituted C2 to C20 heterocycloalkenyl group, a substituted or unsubstituted C2 to C20 heterocycloalkynyl group, or a substituted or unsubstituted C6 to C30 aryl group. $n^2$ to $n^4$ are independently $0 \leq n^2 \leq 2$, $0 \leq n^3 \leq 3$ and $0 \leq n^4 \leq 4$, and $n^5$ and $n^6$ are integers ranging from 1 to 10.

Herein, at least one of $R^5$ to $R^{14}$ is a hydrophilic group such as a hydroxyl group, an amino group, and a thiol group. The hydrophilic group positioned in at least one of $R^5$ to $R^{14}$ improves dissolubility of the copolymer in a solvent.

$R^{18}$ and $R^{19}$ may include at least one hydroxyl group, respectively. For example, when $n^5$ and $n^6$ are respectively 1, the $R^{18}$ and $R^{19}$ are respectively hydroxyl groups. When $n^5$ and $n^6$ are respectively 5, the $R^{18}$ and $R^{19}$ may respectively have five substituent positions. Herein, a hydroxyl group may be positioned in at least one of the five substituents. Since the $R^{18}$ and $R^{19}$ respectively include at least one hydroxyl group, the composition for a hardmask has excellent etching resistance and antireflective properties.

In Chemical Formula 2, $R^{15}$ and $R^{16}$ are independently a substituted or unsubstituted C6 to C30 arylene group. Specifically, $R^{15}$ and $R^{16}$ may be independently a phenylene group, a naphthylene group, or a C1 to C20 alkoxy phenylene group. The C1 to C20 alkoxy phenylene group may be a phenylene group substituted with a C1 to C20 alkoxy group. Since the $R^{15}$ and $R^{16}$ have the substituent, the composition for a hardmask has excellent etching resistance and antireflective properties.

In Chemical Formula 2, $R^{29}$ to $R^{25}$ are independently a substituted or unsubstituted C1 to C20 alkylene group, a substituted or unsubstituted C2 to C20 alkenylene group, a substituted or unsubstituted C2 to C20 alkynylene group, or a substituted or unsubstituted C6 to C30 arylene group. $n^7$ to $n^{10}$ are integers ranging from 0 to 10, respectively.

Specifically, $R^{20}$ to $R^{25}$ are independently a substituted or unsubstituted C1 to C20 alkylene group, or a substituted or unsubstituted C6 to C30 arylene group, and n7 to $n^{10}$ may be integers of 0 to 5. Since the $R^{20}$ to $R^{25}$ have the substituent, the composition for a hardmask has excellent etching resistance and antireflective properties.

In the above Chemical Formula 1, x and y denote a mole fraction of each repeating unit, x+y=1, and $0 \leq x \leq 1$ and $0 \leq y \leq 1$. When the x and y are respectively within the range, the composition for a hardmask has excellent etching resistance and antireflective properties.

In Chemical Formulae 1 and 2, n and m are independently integers ranging from 1 to 200, and specifically 1 to 100. When the n and m are respectively within the range, the composition for a hardmask has excellent etching resistance and antireflective properties.

In addition, the m/n has a mole ratio ranging from 0.01 to 20 and specifically, from 0.01 to 10. When the m/n has a ratio within the range, the copolymer includes more carbons. Accordingly, the composition for a hardmask including the copolymer has excellent etching resistance.

In Chemical Formulae 1 and 2, * denotes a place where chemical parts are linked. *² in Chemical Formula 1 and *³ in Chemical Formula 2 may be linked each other. *¹ in Chemical Formula 1 and *⁴ in Chemical Formula 2 may be linked each other.

The copolymer may be at least one selected from a copolymer including a structural unit represented by the following Chemical Formula 3-1, a copolymer including a structural unit represented by the following Chemical Formula 3-2, a copolymer including a structural unit represented by the following Chemical Formula 3-3, a copolymer including a structural unit represented by the following Chemical Formula 3-4, and a copolymer including a structural unit represented by the following Chemical Formula 3-5.

[Chemical Formula 3-1]
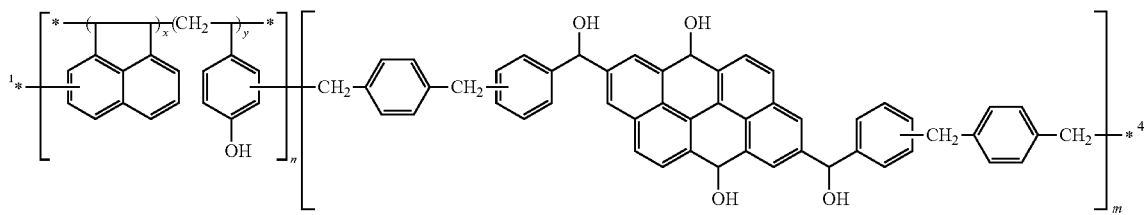
[Chemical Formula 3-2]
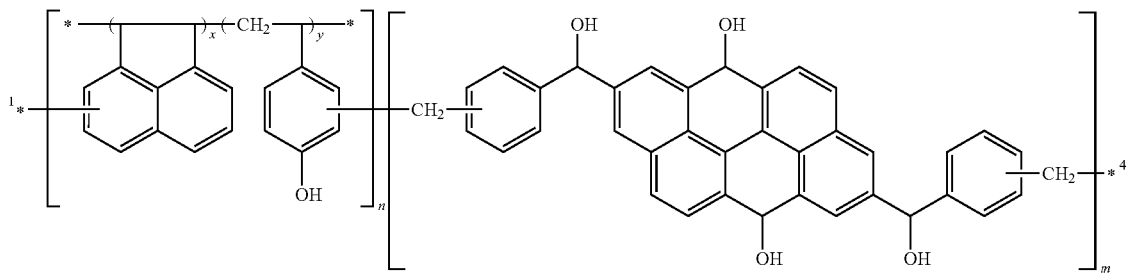
[Chemical Formula 3-3]
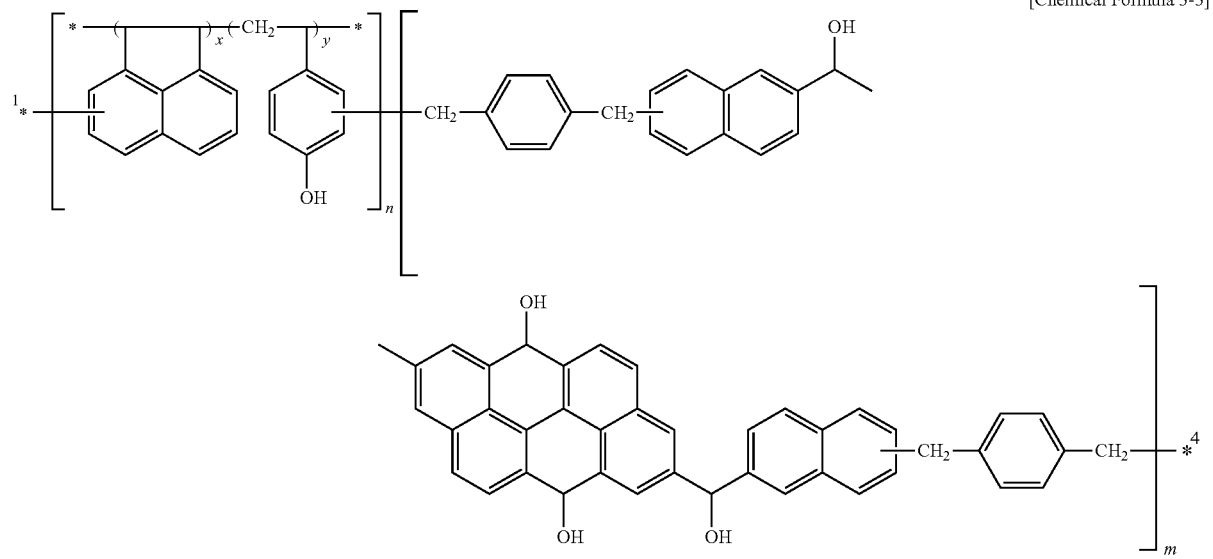
[Chemical Formula 3-4]
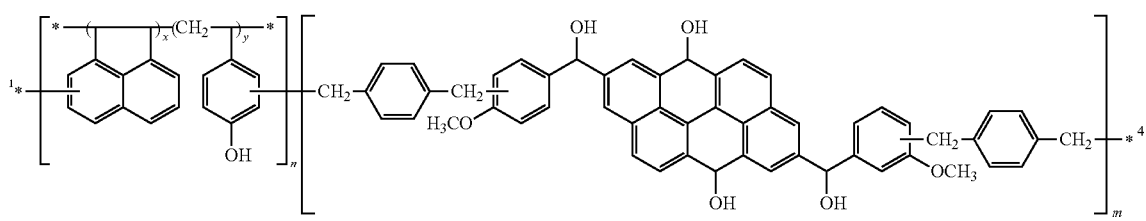
[Chemical Formula 3-5]
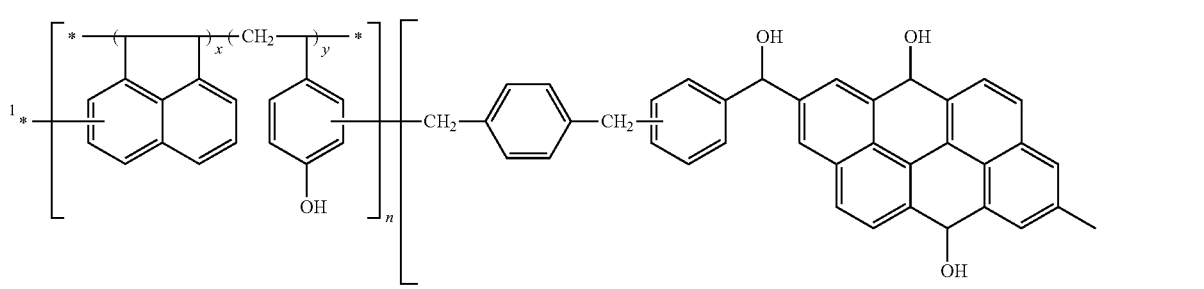

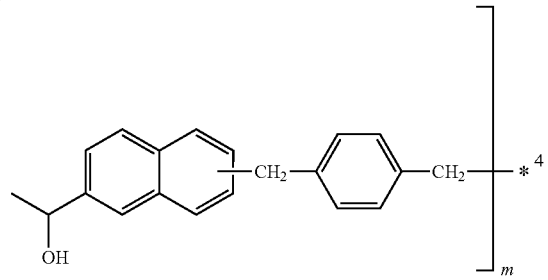

In Chemical Formulae 3-1 to 3-5, x+y=1, 0≤x≤1, 0≤y≤1, and n and m are independently integers ranging from 1 to 200, respectively.

When the copolymer is included in a composition for a hardmask, the copolymer includes more carbons. The composition for a hardmask including the copolymer has excellent etching resistance against carbon in a hardmask layer but less etching resistance against silicon in a material layer during the etching. Accordingly, the composition for a hardmask has low etching selectivity of carbon relative to silicon and excellent antireflective properties.

The copolymer may have a weight average molecular weight of 1,000 g/mol to 1,000,000 g/mol, and specifically 2,000 g/mol to 50,000 g/mol. In addition, the copolymer has a polydispersity (Mw/Mn) ranging from 1.3 to 3.0 and specifically, 1.5 to 2.3. When the copolymer has a weight average molecular weight and a polydispersity within the ranges, the composition for a hardmask has excellent etching resistance and antireflective properties.

The composition for a hardmask may further include a solvent.

The solvent may be anyone having sufficient dissolubility or dispersion for the copolymer, but may be, for example at least one selected from for example propyleneglycol, propyleneglycol diacetate, methoxy propanediol, diethyleneglycol, diethyleneglycol butylether, tri(ethyleneglycol)monomethylether, propyleneglycol monomethylether, propyleneglycol monomethylether acetate, cyclohexanone, ethyllactate, gamma-butyrolactone, and acetylacetone.

The copolymer may be included in an amount of 1 wt % to 50 wt %, and specifically 1 wt % to 30 wt % based on the total amount of the composition for a hardmask.

The solvent may be included in the amount adjusted depending on thickness of the hardmask layer. Specifically, the solvent may be included in a balance amount and specifically, in an amount of 50 wt % to 99 wt % based on the total amount of the composition for a hardmask.

The hardmask composition may include an additive of a surfactant and a cross-linking agent.

The surfactant may be, for example an alkylbenzenesulfonate salt, an alkylpyridinium salt, polyethyleneglycol, a quaternary ammonium salt, and the like, but is not limited thereto.

The acid catalyst is a thermally-activated acid catalyst.

The acid catalyst may include organic acid such as p-toluene sulfonic acid monohydrate or a thermal acid generator (TAG) securing storage stability. The thermal acid generator is an acid generator emitting acid during the heat treatment, for example, pyridinium p-toluene sulfonate, 2,4,4,6-tetrabromocyclohexadienone, benzoin tosylate, 2-nitrobenzyl tosylate, alkylester of organic sulfonic acid, and the like.

The cross-linking agent may cross-link repeating units of the polymer through heating under the acid catalyst, may be an amino resin such as etherified amino resin; a glycoluril compound such as a compound represented by the following Chemical Formula A; a bis-epoxy compound such as a compound represented by the following Chemical Formula B; a melamine compound such as N-methoxymethyl melamine, N-butoxymethyl melamine, and the like; a melamine derivative such as a compound represented by the following Chemical Formula C; or a mixture thereof.

[Chemical Formula A]
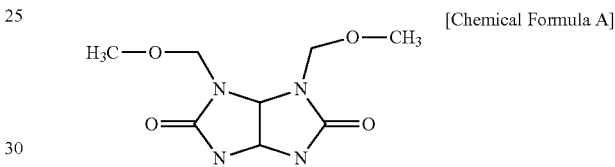

[Chemical Formula B]
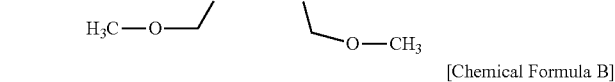

[Chemical Formula C]
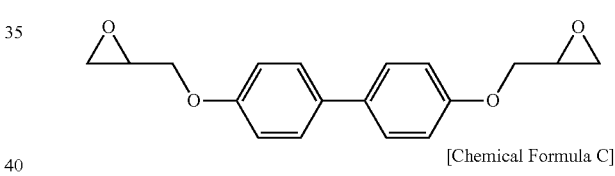

The surfactant, the acid catalyst and the cross-linking agent may be included in each amount of 0.001 to 3 parts by weight based on 100 parts by weight of the composition for a hardmask.

When included in the range, the solubility and the cross-linking property may be ensured while not changing the optical properties of the composition for a hardmask.

Hereinafter, a method of forming a pattern using the composition for a hardmask is described.

The method of forming a pattern according to one embodiment includes providing a material layer on a substrate, applying the composition for a hardmask including the copolymer on the material layer to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, for example, a silicon wafer, a glass substrate, or a polymer substrate.

The material layer is a material to be finally patterned and may be, for example, a metal layer such as aluminum, copper or the like, a semiconductor layer such as silicon, or an insulation layer such as silicon oxide, silicon nitride or the like. The material layer may be obtained by, for example, a chemical vapor deposition (CVD).

The hardmask layer may be formed by applying the composition for a hard mask.

The composition for a hardmask is the same as described above.

The composition for a hardmask may be prepared in a solution and may be applied by a spin-on-coating method. The applied composition for a hardmask is heat-treated to form a hardmask layer.

Herein, the composition for a hardmask has no particular limit in terms of applying thickness, heat treatment condition, and the like but may be, for example, 500 Å to 10,000 Å thick and heat-treated at a temperature ranging from 100° C. to 300° C. for 10 seconds to 10 minutes.

The silicon-containing thin layer may be made of, for example silicon nitride or silicon oxide.

A bottom anti-reflective coating (BARC) may be formed on the silicon-containing thin layer.

Then, on the silicon-containing thin layer or the bottom anti-reflective coating (BARC) layer, a photoresist layer is coated. The photoresist layer may be a radiation-sensitivity imagification layer including a photosensitive material.

Next, the photoresist layer is exposed to a light and developed, forming a photoresist pattern. The exposure may be performed by using, for example, ArF, KrF, E-beam, or the like. In addition, the exposure may be performed through a heat treatment at 100° C. to 500° C.

Then, the photoresist pattern as a mask is used to selectively remove the silicon-containing thin layer and the hardmask layer. Herein, the bottom anti-reflective coating may be removed therewith if formed. Accordingly, the material layer beneath the photoresist pattern may be partly exposed.

Then, the exposed part of the material layer is etched. Herein, the etching may be dry etching using etching gas. The etching gas may include, for example, $CHF_3$, $CF_4$, $CH_4$, $Cl_2$, $BCl_3$, a mixed gas thereof, and the like.

Then, the hardmask layer and photoresist layer may be removed without using a conventional stripper, forming a plurality of patterns of the material layer.

The plurality of patterns may include various patterns such as a metal pattern, a semiconductor pattern, an insulation pattern, and the like inside a semiconductor integrated circuit device. The patterns included in a semiconductor integrated circuit device may be an insulation layer including, for example, a metal wire, a semiconductor pattern, a contact hole, a bias hole, a damascene trench, and the like.

[Mode for Invention]

Hereinafter, the present invention is illustrated in more detail with reference to examples. However, they are exemplary embodiments and are not limiting.

MONOMER SYNTHESIS

Synthesis Example 1-1

30.6 g (100 mmol) of anthanthrone represented as a compound A in the following reaction scheme 1, 28 g (200 mmol) of benzoyl chloride, and 306 g of dichloroethane were put in a flask and dissolved. Next, 26.7 g (200 mmol) of aluminum (III) chloride was slowly added thereto, and the mixture was heated up to 80° C. and agitated for 24 hours. When the reaction was complete, the reactant was cooled down to room temperature, and a potassium hydroxide aqueous solution was added thereto for neutralization. Then, an organic layer was separated from the resulting product, and the remaining solution was concentrated, obtaining 48.3 g (a yield of 94.0%) of a compound B.

51.4 g (100 mmol) of the compound B was dissolved in 514 g of an aqueous solution prepared by mixing methanol and water in a weight ratio of 1:1. Next, 38.83 g (1.0 mol) of sodium borohydride was slowly added to the solution, and the mixture was agitated for 24 hours. When the reaction was complete, a 10% HCl aqueous solution was added to the reactant for neutralization, and ethyl acetate was added thereto for extraction. The extracted organic layer was concentrated under a reduced pressure, obtaining 46.4 g (a yield of 88.7%) of a monomer C.

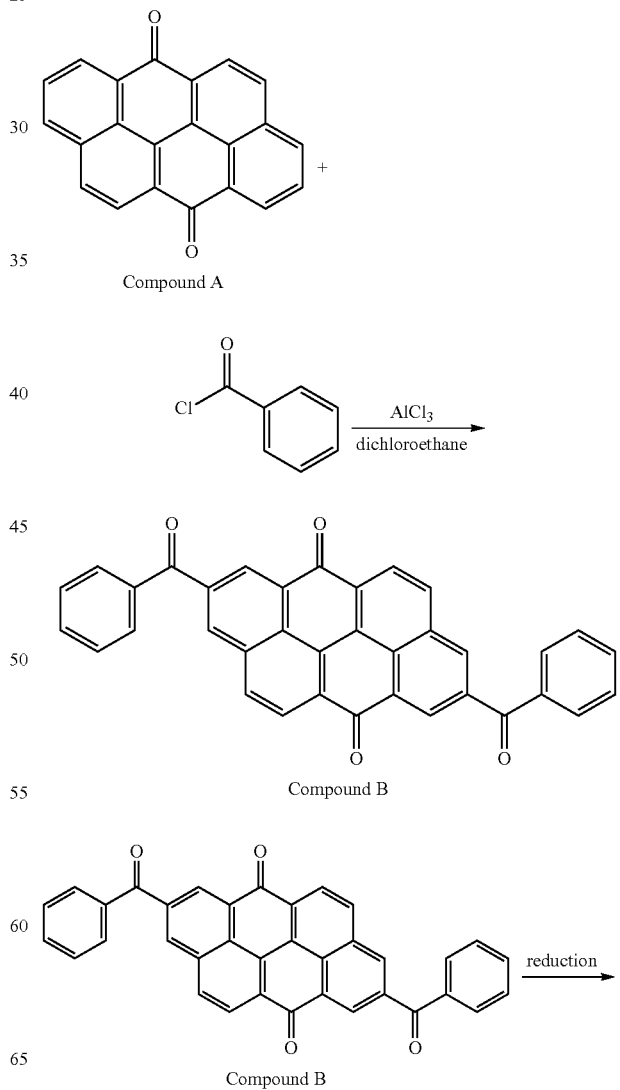

[Reaction Scheme 1]

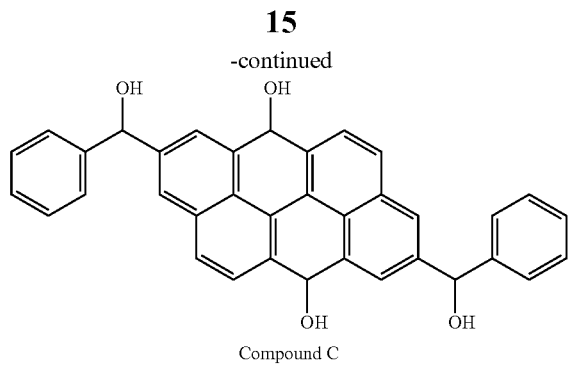

Compound C

Synthesis Example 1-2

The following monomer D (a yield of 76%) was synthesized according to the same method as Synthesis Example 1-1 except for using naphtoyl chloride instead of benzoyl chloride.

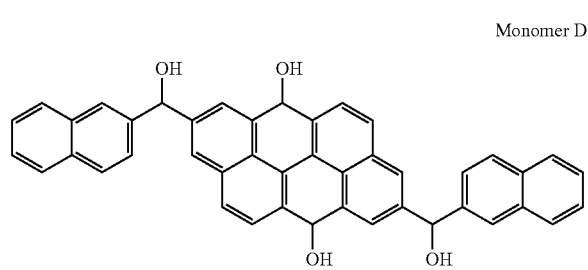 [SMILES: OC(c1ccc2ccccc2c1)c1cc2c3c4c(ccc3c1)C(O)c1cc(C(O)c3ccc5ccccc5c3)cc3ccc(c-4c13)C2O]

Monomer D

Synthesis Example 1-3

The following monomer E (yield 83%) was synthesized according to the same method as Synthesis Example 1-1 except for using 4-methoxybenzoyl chloride instead of benzoyl chloride.

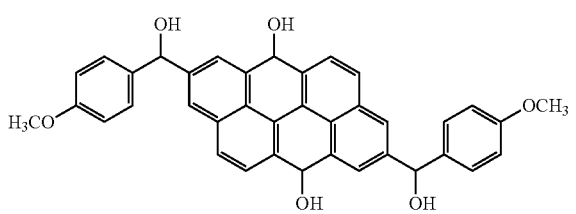

Monomer E

Synthesis Example 1-4

The following monomer F (a yield of 86%) was synthesized according to the same method as Synthesis Example 1-1 except for using 100 mmol of benzoyl chloride and 100 mmol of naphtoyl chloride instead of 200 mmol of benzoyl chloride.

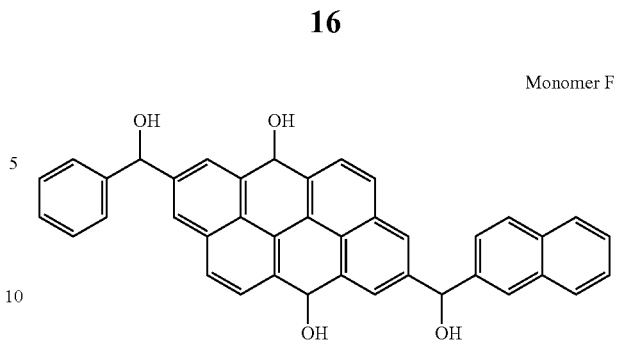

Monomer F

Synthesis Example 1-5

91.3 g of acenaphthylene, 206.6 g of 4-acetoxystyrene, 1.97 g of 2,2'-azobisisobutyronitrile (AIBN), and 161.48 g of propylene glycol monomethyl ether acetate (PGMEA) were put in a 500 mL 4 necked flask having a thermometer, a condenser, a nitrogen gas purging nozzle, and a machine agitator. The prepared solution was degassed for 20 minutes. The degassed solution was heated up to 70° C. and agitated at the same temperature for 24 hours. The polymerized solution was cooled down to room temperature and precipitated in methanol. The precipitate was dried in a 45° C. oven for 24 hours. The resulting product was mixed with hydrazine anhydride in 1,4-dioxane for hydrolysis (a volume ratio of 1:8:1). The mixture was agitated at room temperature for 12 hours. Then, methanol agitated at a fast speed in an excessive amount was added thereto in a dropwise fashion to precipitate a polymer. The solid polymer was filtered, washed with methanol, and dried at 45° C. under vacuum for 24 hours, obtaining a polymer represented by the following Chemical Formula 4.

The obtained polymer had a weight average molecular weight of 10,800 g/mol and polydispersity of 1.3, in which GPC (gel permeation chromatography) was used.

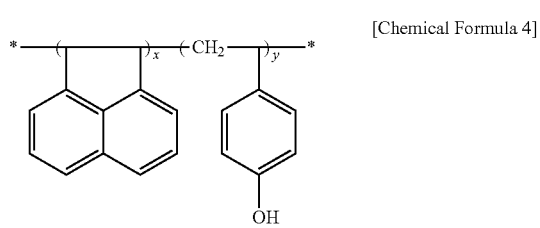

[Chemical Formula 4]

In Chemical Formula 4, $x=0.2$ and $y=0.8$.

COPOLYMER SYNTHESIS

Synthesis Example 2-1

13.2 g of the monomer C prepared according to Synthesis Example 1-1, 4.25 g of 1,4-bis(methoxymethyl)benzene, and 99.27 g of propylene glycol monomethyl ether acetate (PGMEA) were agitated for 20 minutes and dissolved, and 0.3 g of diethylsulfate was added thereto. The mixture was hated at 130° C. for 8 hours. Next, 52.94 g of the polymer prepared according to Synthesis Example 1-5 was added to the reaction mixture. The resulting mixture was heated at the same temperature for 4 hours. The obtained copolymer was precipitated in methanol, dissolved in 20 g of PGMEA, and then, reprecipitated in methanol. In this way, a copolymer represented by the following Chemical Formula 3-1 was obtained.

The copolymer had a GPC-measured weight average molecular weight of 17,200 g/mol and polydispersity of 1.7.

In Chemical Formula 3-2, x=0.2, y=0.8, n=90 and m=10.

[Chemical Formula 3-1]

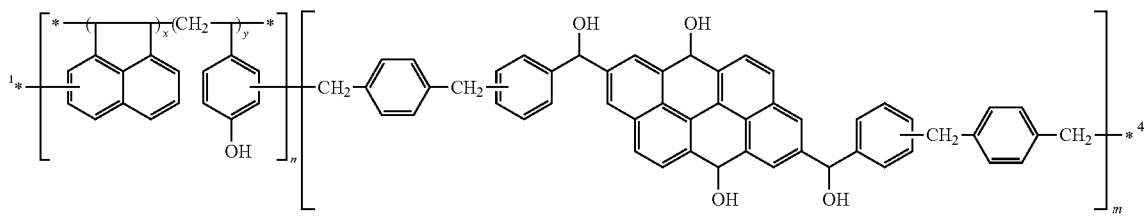

In Chemical Formula 3-1,
x=0.2, y=0.8, n=90, and m=10.

Synthesis Example 2-2

13.2 g of the monomer C according to Synthesis Example 1-1 and 0.92 g of paraformaldehyde were put in 99.27 g of propylene glycol monomethyl ether acetate (PGMEA). The mixture was agitated for 20 minutes and dissolved, and 0.3 g of diethylsulfate was added thereto. The resulting mixture was heated at 130° C. for 8 hours. Next, 52.94 g of the polymer according to Synthesis Example 1-5 was added to the reaction mixture, and the obtained mixture was heated at the same temperature for 4 hours. The obtained copolymer was precipitated in methanol, dissolved with 20 g of PGMEA, and then, reprecipitated in methanol. In this way, a copolymer represented by the following Chemical Formula 3-2 was obtained.

The copolymer had a GPC-measured weight average molecular weight of 16,500 g/mol and polydispersity of 1.7.

Synthesis Example 2-3

16.0 g of the monomer D according to Synthesis Example 1-2 and 4.25 g of 1,4-bis(methoxymethyl)benzene were put in 99.27 g of propylene glycol monomethyl ether acetate (PGMEA), and the mixture was agitated and dissolved for 20 minutes, and 0.3 g of diethylsulfate was added thereto. The resulting mixture was heated at 130° C. for 8 hours. Next, 52.94 g of the polymer according to Synthesis Example 1-5 was added to the reaction mixture. The resulting mixture was heated at the same temperature for 4 hours. The obtained copolymer was precipitated in methanol, dissolved in 20 g of PGMEA, and then, reprecipitated in methanol. In this way, a copolymer represented by the following Chemical Formula 3-3 was obtained.

The copolymer had a GPC-measured weight average molecular weight of 15,200 g/mol and polydispersity of 1.8.

[Chemical Formula 3-2]

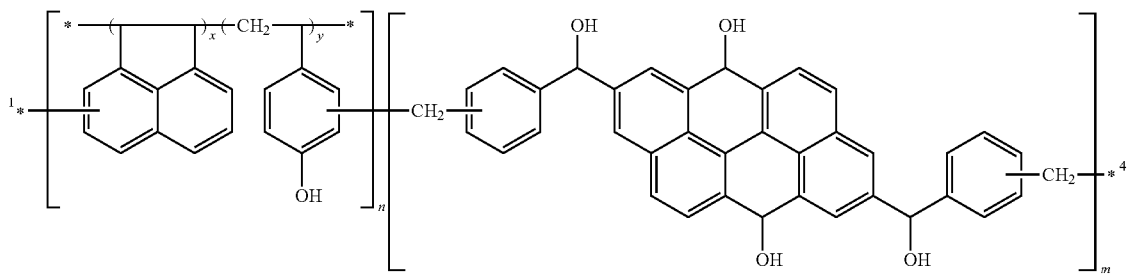

[Chemical Formula 3-3]

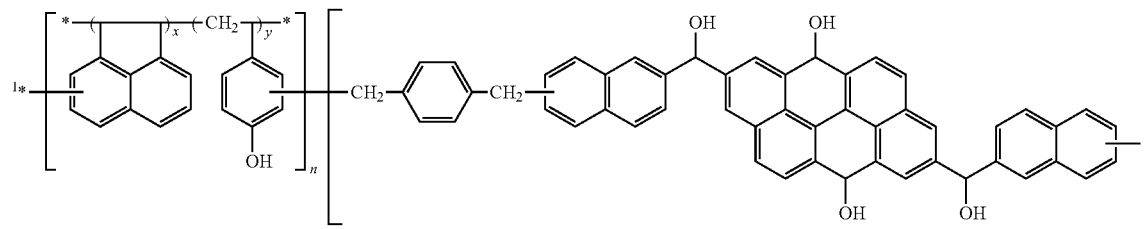

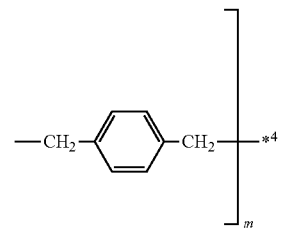

In Chemical Formula 3-3,
x=0.2, y=0.8, n=90 and m=10.

In Chemical Formula 3-4,
x=0.2, y=0.8, n=90 and m=10.

Synthesis Example 2-4

15.0 g of the monomer E according to Synthesis Example 1-3 and 1,4-4.25 g of bis(methoxymethyl)benzene were put in 99.27 g of propylene glycol monomethyl ether acetate (PGMEA). The mixture was agitated and dissolved for 20 minutes, and 0.3 g of diethylsulfate was added thereto. The obtained mixture was heated at 130° C. for 8 hours. Next, 52.94 g of the polymer according to Synthesis Example 1-5 was added to the reaction mixture, and the obtained mixture was heated at the same temperature for 4 hours. Then, the resulting mixture was precipitated in methanol, dissolved in 20 g of PGMEA, and reprecipitated in methanol. In this way, a copolymer represented by the following Chemical Formula 3-4 was obtained.

The copolymer had a GPC-measured weight average molecular weight of 16,300 g/mol and polydispersity of 1.9.

Synthesis Example 2-5

14.7 g of the monomer F according to Synthesis Example 1-4 and 4.25 g of 1,4-bis(methoxymethyl)benzene were put in 99.27 g of propylene glycol monomethyl ether acetate (PGMEA). The mixture was agitated and dissolved for 20 minutes, and 0.3 g of diethylsulfate was added thereto. The resulting mixture was heated at 130° C. for 8 hours. Next, 52.94 g of the polymer according to Synthesis Example 1-5 was added to the reaction mixture. The obtained mixture was heated at the same temperature for 4 hours. The reactant was precipitated in methanol, dissolved in 20 g of PGMEA, and reprecipitated in methanol. In this way, a copolymer represented by the following Chemical Formula 3-5 was obtained.

The copolymer had a GPC-measured weight average molecular weight of 16,700 g/mol and polydispersity of 1.8.

[Chemical Formula 3-4]

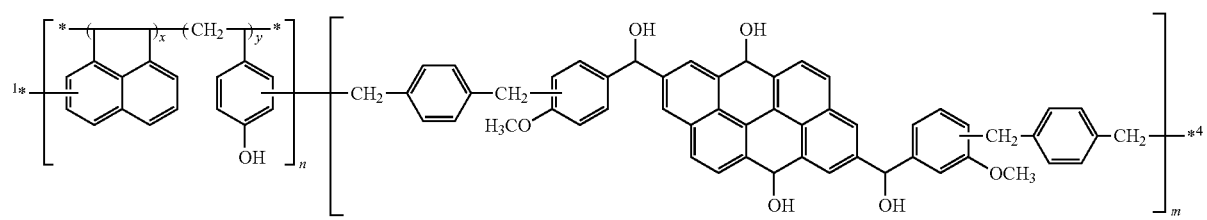

[Chemical Formula 3-5]

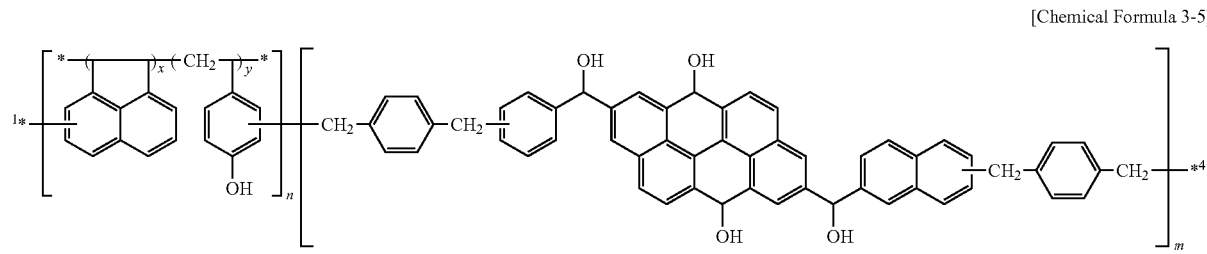

In Chemical Formula 3-5,
x=0.2, y=0.8, n=90 and m=10.

Preparation of Composition for Hardmask

Examples 1 to 5

0.8 g of each copolymer according to Synthesis Examples 2-1 to 2-5, 2 mg of pyridinium p-toluene sulfonate as an acid catalyst, 0.2 g of a glycoluril compound represented by the following Chemical Formula A as a cross-linking agent, and 9 g of propyleneglycol monomethylether acetate (PGMEA) as a solvent were mixed and filtered, preparing a composition for a hardmask.

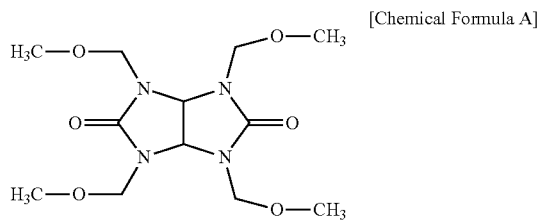

[Chemical Formula A]

Comparative Example 1

0.8 g of the polymer according to Synthesis Example 1-5, 2 mg of pyridinium p-toluenesulfonate as an acid catalyst, 0.2 g of a glycoluril compound represented by the above Chemical Formula A as a cross-linking agent, and 9 g of propylene glycol monoethyl ether acetate (PGMEA) as a solvent were mixed and filtered, preparing a composition for a hardmask.

(Formation of Hardmask Layer)

The compositions for a hardmask according to Examples 1 to 5 and Comparative Example 1 were respectively spin-on coated on a silicon wafer including a silicon nitride layer and heated at 200° C. for 60 seconds, forming an 1,500 Å-thick hardmask layer.

Evaluation 1: Optical Properties

The compositions for a hardmask according to Examples 1 to 5 and Comparative Example 1 were respectively coated to form hardmask layers. The hardmask layers were measured regarding refractive index (n) and extinction coefficient (k). The results are provided in the following Table 1. The refractive index and the extinction coefficient were measured by respectively radiating a light at a wavelength of 193 nm and 248 nm with Ellipsometer (J.A. Woollam Co.).

TABLE 1

| | Optical properties 193 nm | | Optical properties 248 nm | |
|---|---|---|---|---|
| | Refractive index (n) | Extinction coefficient (k) | Refractive index (n) | Extinction coefficient (k) |
| Example 1 | 1.47 | 0.76 | 2.01 | 0.36 |
| Example 2 | 1.49 | 0.79 | 1.98 | 0.32 |
| Example 3 | 1.46 | 0.81 | 1.96 | 0.33 |
| Example 4 | 1.50 | 0.77 | 2.03 | 0.34 |
| Example 5 | 1.39 | 0.76 | 2.07 | 0.32 |
| Comparative Example 1 | 1.42 | 0.83 | 1.93 | 0.25 |

Referring to Table 1, the hardmask layers formed by using the compositions for a hardmask according to Examples 1 to 5 had refractive index (n) and extinction coefficient (k) appropriate for a hardmask at a wavelength of 193 nm and 248 nm.

Evaluation 2: Etching Resistance

The hardmask layers formed by using the compositions for a hardmask according to Examples 1 to 5 and Comparative Example 1 were dry-etched with a mixed gas of $CF_4$ and $CHF_3$. The hardmask layers were measured regarding thickness before and after the etching by using a thin membrane thickness measuring device (K-MAC Co. Ltd.). The etching was performed under the conditions provided in the following Table 2. The results are provided in the following Table 3.

TABLE 2

| Chamber pressure | 40.0 | Pa |
| RF power | 1300 | W |
| Gap | 9 | nm |
| $CHF_3$ flow | 30 | ml/minute |
| $CF_4$ flow | 30 | ml/minute |
| Ar gas flow | 100 | ml/minute |
| time | 60 | seconds |

TABLE 3

| | Etching-rate (nm/minute) |
|---|---|
| Example 1 | 54 |
| Example 2 | 53 |
| Example 3 | 60 |
| Example 4 | 71 |
| Example 5 | 56 |
| Comparative Example 1 | 83 |

Referring to Table 3, the hardmask layers formed by using the compositions for a hardmask according to Examples 1 to 5 had a low etching-rate for the mixed gas of $CF_4$ and $CHF_3$ and thus, excellent etching resistance.

(Formation of Photoresist Pattern)

The compositions for a hardmask according to Examples 1 to 5 and Comparative Example 1 were respectively spin-on coated on a silicon wafer including a silicon nitride (SiN) layer and heat-treated at 200° C. for 60 seconds, forming 4,000 Å-thick hardmask layers.

Then, an ArF photoresist was coated to be 1,700 Å thick on the hardmask layers and then, heat-treated at 110° C. for 60 seconds and exposed to a light using ASML (XT:1400, NA0.93). The exposed product was developed in an aqueous solution including 2.38 wt % of tetramethyl ammonium hydroxide (TMAH), forming a photoresist pattern.

Evaluation 3: Pattern Formation

The hardmask layers were dry-etched using the photoresist pattern as a mask and a mixed gas of $O_2/N_2$. Then, the silicon nitride was dry-etched using the hardmask and a mixed gas of $CHF_3/CF_4$. The remaining hardmask and organic material were $O_2$-ashed and wet striped. After etching the silicon nitride and the hardmask, each specimen was examined about cross-section with FE-SEM. The results are provided in the following Table 4.

TABLE 4

| | Pattern profile after etching hardmask | Pattern profile after etching silicon nitride |
|---|---|---|
| Example 1 | Anisotropic shape | Anisotropic shape |
| Example 2 | Anisotropic shape | Anisotropic shape |
| Example 3 | Anisotropic shape | Anisotropic shape |

TABLE 4-continued

| | Pattern profile after etching hardmask | Pattern profile after etching silicon nitride |
|---|---|---|
| Example 4 | Anisotropic shape | Anisotropic shape |
| Example 5 | Anisotropic shape | Anisotropic shape |
| Comparative Example 1 | Bow shape | Tapered shape |

Referring to Table 4, the hardmask layers formed of the compositions for a hardmask according to Examples 1 to 5 and the silicon nitride layer beneath them were all patterned to have an anisotropic shape, while the hardmask layer formed of the composition for a hardmask according to Comparative Example 1 was patterned to have a bow shape or a tapered shape.

The reason is that the compositions for a hardmask according to Examples 1 to 5 had sufficient resistance against etching gas and were well etched, while the composition for a hardmask according to Comparative Example 1 had insufficient resistance against etching gas and thus, lacked of an etching selectivity for patterning the silicon nitride layer to have an appropriate profile.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A composition for a hardmask, the composition comprising:
a copolymer including repeating units represented by the following Chemical Formulae 1 and 2; and
a solvent:

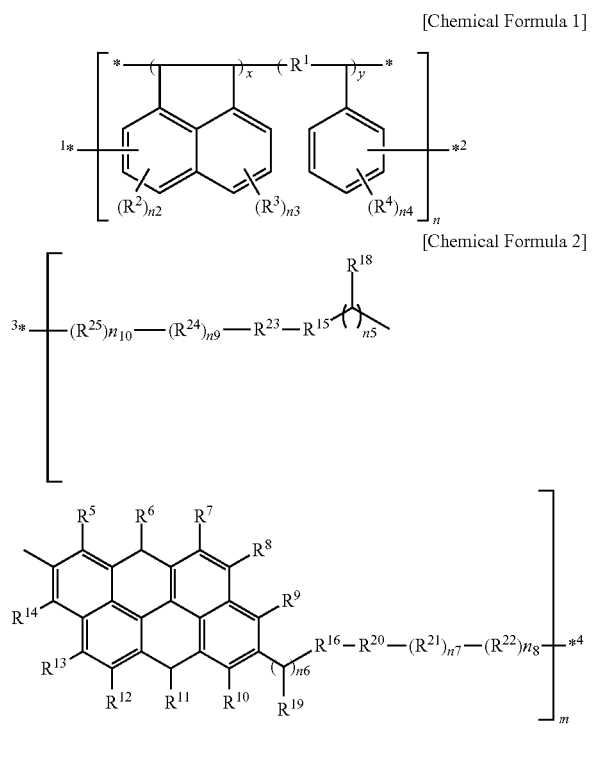

wherein, in Chemical Formulae 1 and 2,
$R^1$ is a substituted or unsubstituted C1 to C20 alkylene group, a substituted or unsubstituted C2 to C20 alkenylene group, a substituted or unsubstituted C2 to C20 alkynylene group, or a substituted or unsubstituted C6 to C30 arylene group,
$R^2$ to $R^4$, $R^5$ to $R^{14}$, $R^{18}$, and $R^{19}$ are each independently hydrogen, a hydroxyl group, an amino group, a thiol group, a substituted or unsubstituted C1 to C20 alkyl group, a substituted or unsubstituted C2 to C20 alkenyl group, a substituted or unsubstituted C2 to C20 alkynyl group, a substituted or unsubstituted C1 to C20 alkoxy group, a substituted or unsubstituted C3 to C20 cycloalkyl group, a substituted or unsubstituted C3 to C20 cycloalkenyl group, a substituted or unsubstituted C3 to C20 cycloalkynyl group, a substituted or unsubstituted C2 to C20 heterocycloalkyl group, a substituted or unsubstituted C2 to C20 heterocycloalkenyl group, a substituted or unsubstituted C2 to C20 heterocycloalkynyl group, or a substituted or unsubstituted C6 to C30 aryl group, provided that at least one of $R^5$ to $R^{14}$ is a hydroxyl group, an amino group, or a thiol group, and $R^{18}$ and $R^{19}$ include at least one hydroxyl group, respectively,
$R^{15}$ and $R^{16}$ are each independently a substituted or unsubstituted C6 to C30 arylene group,
$R^{20}$ to $R^{25}$ are each independently a substituted or unsubstituted C1 to C20 alkylene group, a substituted or unsubstituted C2 to C20 alkenylene group, a substituted or unsubstituted C2 to C20 alkynylene group, or a substituted or unsubstituted C6 to C30 arylene group,
$n^2$ to $n^4$ are each independently integers that satisfy the following relations: $0 \leq n^2 \leq 2$, $0 \leq n^3 \leq 3$ and $0 \leq n^4 \leq 4$,
$n^5$ and $n^6$ are each independently integers ranging from 1 to 10,
$n^7$ to $n^{10}$ are each independently integers ranging from 0 to 10,
x and y are each independently integers that satisfy the following relations: $x+y=1$, $0 \leq x \leq 1$, and $0 \leq y \leq 1$,
n and m are each independently integers ranging from 1 to 200, and
to *4 are binding sites to another repeating unit or terminal group.

2. The composition for a hardmask as claimed in claim 1, wherein, in Chemical Formula 2, $R^{15}$ and $R^{16}$ are each independently a phenylene group, a naphthylene group, or a C1 to C20 alkoxy phenylene group.

3. The composition for a hardmask as claimed in claim 1, wherein, in Chemical Formula 2, $R^{20}$ to $R^{25}$ are each independently a substituted or unsubstituted C1 to C20 alkylene group or substituted or unsubstituted C6 to C30 arylene group, and
$n^7$ to $n^{10}$ are each independently integers of 0 to 5.

4. The composition for a hardmask as claimed in claim 1, wherein, in Chemical Formulae 1 and 2, n and m are each independently integers of 1 to 100.

5. The composition for a hardmask as claimed in claim 1, wherein, in Chemical Formulae 1 and 2, a ratio of m/n is 0.01 to 20.

6. The composition for a hardmask as claimed in claim 1, wherein the copolymer includes at least one selected from a structural unit represented by the following Chemical Formula 3-1, a structural unit represented by the following Chemical Formula 3-2, a structural unit represented by the following Chemical Formula 3-3, a structural unit represented by the following Chemical Formula 3-4, and a structural unit represented by the following Chemical Formula 3-5:

[Chemical Formula 3-1]
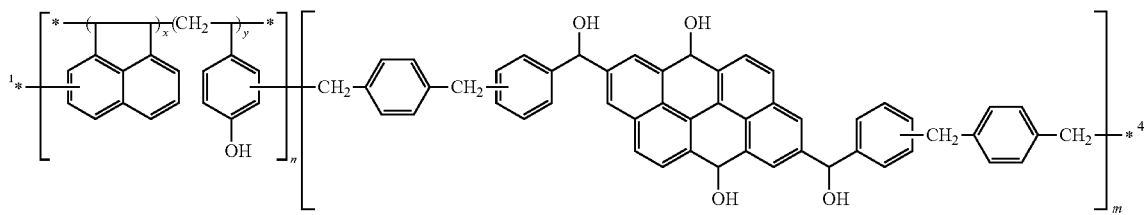
[Chemical Formula 3-2]
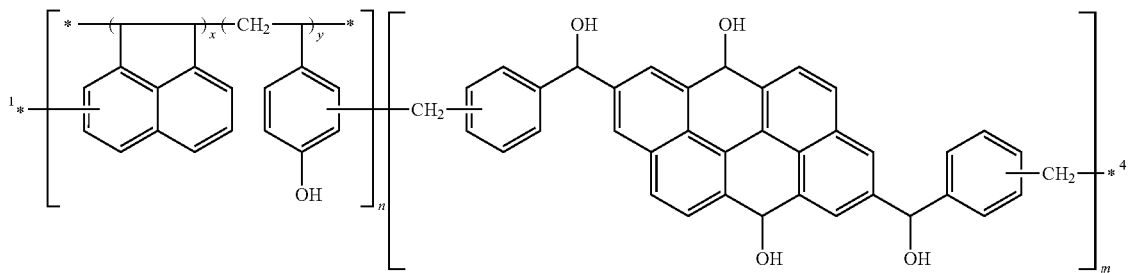
[Chemical Formula 3-3]
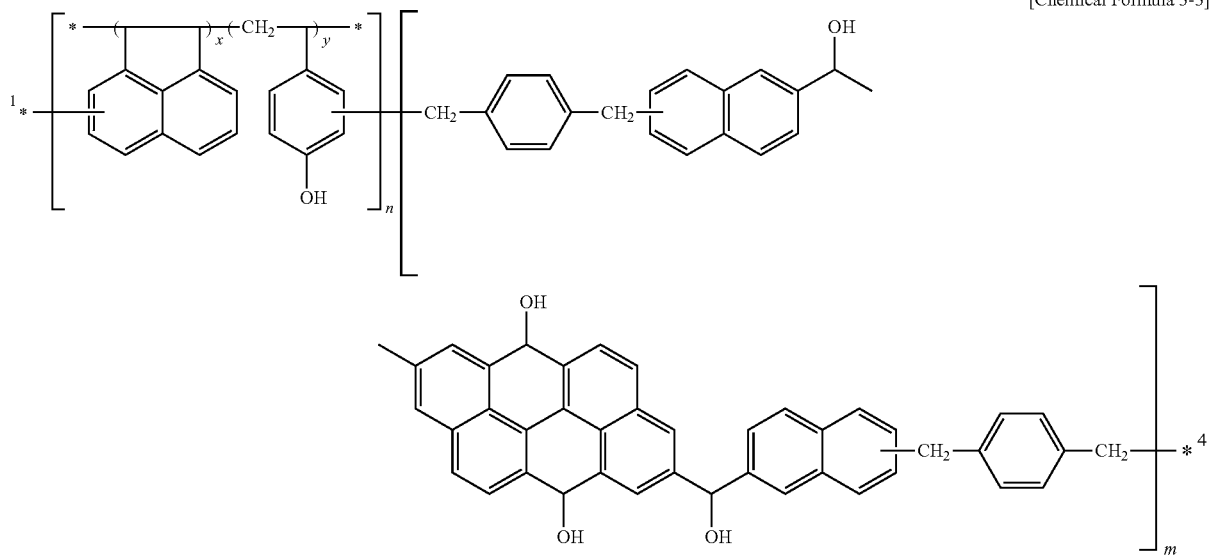
[Chemical Formula 3-4]
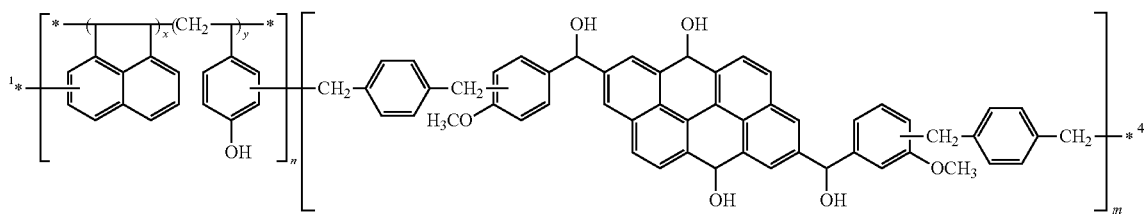
[Chemical Formula 3-5]
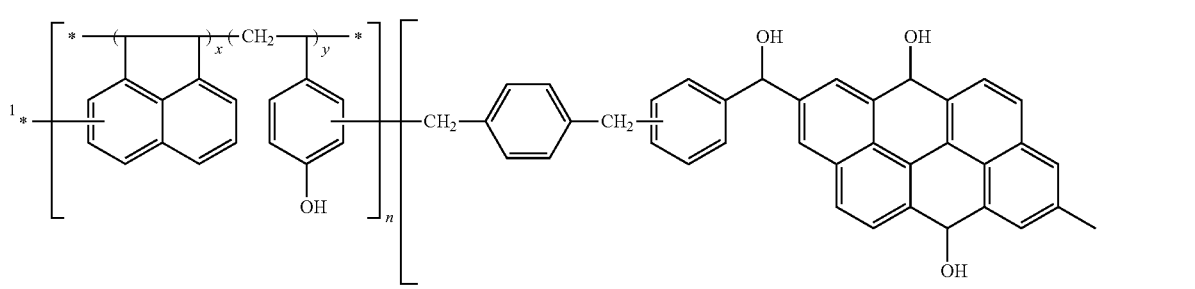

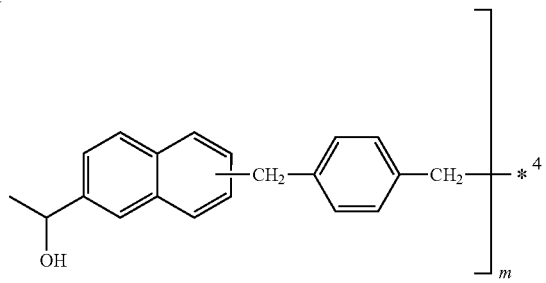

wherein, in Chemical Formulae 3-1 to 3-5,
x and y are each independently integers that satisfy the following relations: x+y=1, 0≤x≤1, 0≤y≤1,
n and m are each independently integers ranging from 1 to 200, and
*¹ to *⁴ are the same as those defined with respect to Chemical Formulae 1 and 2.

7. The composition for a hardmask as claimed in claim 1, wherein the copolymer has a weight average molecular weight of 1,000 to 1,000,000 g/mol.

8. The composition for a hardmask as claimed in claim 1, wherein the copolymer is included in an amount of 1 wt % to 50 wt % based on the total amount of the composition for a hardmask.

9. A method of forming a pattern, the method comprising:
providing a material layer on a substrate;
applying the composition for a hardmask of claim 1 on the material layer to form a hardmask layer;
forming a silicon-containing thin layer on the hardmask layer;
forming a photoresist layer on the silicon-containing thin layer;
exposing and developing the photoresist layer to form a photoresist pattern;
selectively removing the silicon-containing thin layer and hardmask layer using the photoresist pattern to expose a part of the material layer; and
etching an exposed part of the material layer.

10. The method of forming a pattern as claimed in claim 9, wherein applying the composition for a hardmask on the material layer includes performing a spin-on coating method.

11. The method of forming a pattern as claimed in claim 9, further comprising forming a bottom anti-reflection coating (BARC) on the silicon-containing thin layer after forming the silicon-containing thin layer.

12. The method of forming a pattern as claimed in claim 9, further comprising heat treating the composition for a hardmask after applying the composition on the material layer such that the composition is heat-treated at 100° C. to 300° C.

* * * * *